United States Patent
Cho et al.

(10) Patent No.: US 8,243,541 B2
(45) Date of Patent: Aug. 14, 2012

(54) METHODS AND APPARATUSES FOR IMPROVING REDUCED POWER OPERATIONS IN EMBEDDED MEMORY ARRAYS

(75) Inventors: Hoyeol Cho, Palo Alto, CA (US);
Heechoul Park, San Jose, CA (US);
Song C. Kim, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 853 days.

(21) Appl. No.: 12/340,529

(22) Filed: Dec. 19, 2008

(65) Prior Publication Data

US 2010/0157706 A1 Jun. 24, 2010

(51) Int. Cl.
*G11C 7/00* (2006.01)
(52) U.S. Cl. ................ 365/203; 365/227; 365/230.06
(58) Field of Classification Search .................. 365/49, 365/203, 189.08, 230.06, 226, 227
See application file for complete search history.

(56) References Cited

U.S. PATENT DOCUMENTS

| | | |
|---|---|---|
| 7,423,900 B2 * | 9/2008 | Tokito ........................ 365/154 |
| 2006/0056229 A1 * | 3/2006 | Maeda et al. ................ 365/154 |

* cited by examiner

*Primary Examiner* — Alexander Sofocleous
*Assistant Examiner* — Hien Nguyen
(74) *Attorney, Agent, or Firm* — Polsinelli Shughart PC

(57) ABSTRACT

Methods and apparatuses are presented for improving reduced power operations in embedded memory arrays. Some embodiments may include a microprocessor, the microprocessor including at least one execution unit, a memory coupled to the execution unit, the memory including, a memory cell comprising a memory cell bus, a power circuit selectively coupling the memory cell bus to a first power plane and a second power plane, where the memory cell bus is coupled to the second power plane when the power circuit is substantially off, and a bit line pre-charge circuit coupled to the power circuit, where the power circuit selectively couples the first power plane to the pre-charge circuit for a predetermined period of time.

20 Claims, 9 Drawing Sheets

METHODS AND APPARATUSES FOR IMPROVING REDUCED POWER OPERATIONS IN EMBEDDED MEMORY ARRAYS

CROSS-REFERENCE TO RELATED APPLICATIONS

This application is related to U.S. Nonprovisional patent application Ser. No. 12/133,808, entitled "Write and Read Assist Circuit for SRAM with Power Recycling," filed on Jun. 5, 2008 and incorporated by reference as if set forth in full below.

BACKGROUND

Computers are ubiquitous in today's society. They come in all different varieties and can be found in places such as automobiles, the grocery store, banks, personal digital assistants, cell phones, as well as in many businesses. As will be appreciated by almost anyone owning a computer, there is a trend of incorporating more and more functionality into the same amount of space. This trend may be due to many factors, such as, the miniaturization and increasing density of system components with each successive generation of computer. For example, the minimum feature size of transistors continues to decrease with successive generations of microprocessors, a phenomena which is sometimes referred to as Moore's law.

Transistors with smaller feature sizes may be capable of executing instructions faster than their predecessors. Accordingly, there is also an ever increasing need to integrate more and more memory on the same chip as the microprocessor—i.e., to "embed" memory alongside other circuitry that the memory serves. This memory is sometimes referred to as "cache" memory. While decreasing the transistor feature sizes may cause an increase in the overall amount of memory that may be implemented in the microprocessor, the smaller transistors that are used to make this memory also may be more prone to leakage currents during standby conditions than their predecessors. As a result, the overall amount of power consumed during standby for these cache memories undesirably may increase with each successive generation because the memory sizes may be larger and because the constituent transistors leak more during standby. Unfortunately, attempting to control power consumption in cache memories often produces undesirable results such as larger memories, slower memories, and/or memories that are more prone to errors because of decreased noise margins. Thus, methods and apparatuses are needed that address one or more of these problems.

SUMMARY

Methods and apparatuses are presented for improving reduced power operations in embedded memory arrays. Some embodiments may include a microprocessor, the microprocessor including at least one execution unit, a memory coupled to the execution unit, the memory including, a memory cell comprising a memory cell bus, a power circuit selectively coupling the memory cell bus to a first power plane and a second power plane, where the memory cell bus is coupled to the second power plane when the power circuit is substantially off, and a bit line pre-charge circuit coupled to the power circuit, where the power circuit selectively couples the first power plane to the pre-charge circuit for a predetermined period of time.

Other embodiments may include a memory, the memory including a memory cell comprising a memory cell bus, a power circuit selectively coupling the memory cell bus to a first power plane and a second power plane, where the memory cell bus is coupled to the second power plane when the power circuit is substantially off, and a bit line pre-charge circuit coupled to the power circuit, where the power circuit selectively couples the first power plane to the pre-charge circuit for a predetermined period of time.

Other embodiments may include a method of operating a memory, the method including providing a power circuit with a first power plane and a second power plane, coupling a pre-charge circuit to the power circuit such that the pre-charge circuit is coupled to the second power plane, and selectively coupling the first power plane to the pre-charge circuit for a predetermined period of time.

Still other embodiments may include a microprocessor, the microprocessor including at least one execution unit, a memory coupled to the execution unit, the memory including a first memory cell, and a first bit line coupled to the first memory cell, where the first bit line is charged to a first pre-charge state for a first predetermined period of time and where the first bit line is charged to a second pre-charge state for a second predetermined period of time prior to a first access to the memory.

Other embodiments may include a memory, the memory including a first memory cell, and a first bit line coupled to the first memory cell, where the first bit line is charged to a first pre-charge state for a first predetermined period of time and where the first bit line is charged to a second pre-charge state for a second predetermined period of time prior to a first access to the memory.

Other embodiments may include a method of operating a memory, the method including coupling a first bit line to a first memory cell within a memory, charging the first bit line to a first pre-charge state for a first predetermined period of time, charging the first bit line to a second pre-charge state for a second predetermined period of time, and accessing the memory a first time, where the second predetermined period of time occurs prior to accessing the memory the first time.

Still other embodiments may include a microprocessor, the microprocessor including at least one execution unit, a memory coupled to the execution unit, the memory including a pre-charge circuit coupled to a memory cell, where the pre-charge circuit pre-charges a plurality of bit lines associated with the memory cell to a predetermined value, and a write driver circuit coupled to the memory cell bus, where a first bit line within of the plurality of bit lines maintains the predetermined value prior to a memory access while a second bit line within the plurality of bit lines is discharged.

Other embodiments may include a memory, the memory including a pre-charge circuit coupled to a memory cell, where the pre-charge circuit pre-charges a plurality of bit lines associated with the memory cell to a predetermined value, and a write driver circuit coupled to the memory cell bus, where a first bit line within of the plurality of bit lines maintains the predetermined value prior to a memory access while a second bit line within the plurality of bit lines is discharged.

Other embodiments may include a method of operating a memory, the method including coupling a pre-charge circuit to a memory cell, pre-charging a plurality of bit lines associated with the memory cell to a predetermined value, coupling a write driver to the memory cell, and maintaining the predetermined value on a first bit line within the plurality of bit lines prior to a memory access while a second bit line within the plurality of bit lines is being discharged

BRIEF DESCRIPTION OF THE DRAWINGS

For a detailed description of the various embodiments of the invention, reference will now be made to the accompanying drawings.

The use of the same reference symbols in different drawings indicates similar or identical items.

DETAILED DESCRIPTION

In some embodiments, methods and apparatuses may be provided that allow an embedded memory to operate at a reduced power state while having improved performance. Because embedded memories operating at reduced power states may share a low voltage between the memory cell and other cells within the memory array, a power dip may be noticed when pre-charging one or more bit lines, which may impact a memory cell's SNM. Some embodiments may compensate for this power dip by adjusting the bit line voltage prior to disabling access to the memory cell voltage.

Also, because embedded memories operating at reduced power states may operate at lower voltages, one or more bit lines within these embedded memories may be pre-charged to a lower voltage. These bit lines may discharge from this lower voltage to an undesirably low state during read operations and hinder performance. Some embodiments may compensate for this discharge by adjusting the bit line voltage for a predetermined period of time prior to accessing the memory cell.

Furthermore, while conventional memory write approaches may attempt to perform memory write operations using higher voltages (for example to increase SNM), some embodiments may include embedded memories operating at reduced power states that utilize a lower memory cell voltage for memory write operations. This may result in increased write speed.

Figure 1:
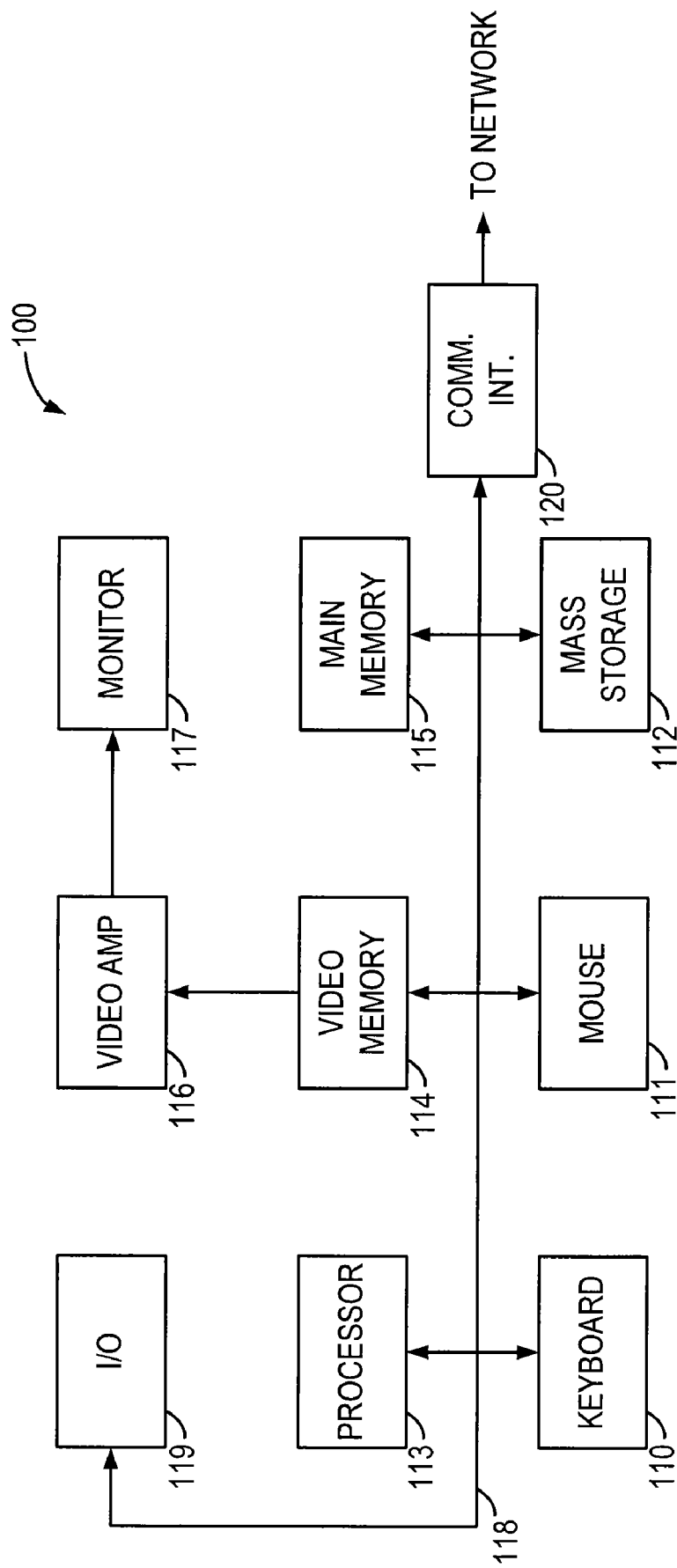
FIG. 1 illustrates an exemplary computer system.

FIG. 1 illustrates a computer system 100. In some embodiments, the computer system 100 may be an implementation of enterprise level computers, such as one or more blade-type servers within an enterprise. In other embodiments, the computer system 100 may be a personal computer and/or a handheld electronic device. A keyboard 110 and mouse 111 may be coupled to the computer system 100 via a system bus 118. The keyboard 110 and the mouse 111, in one example, may introduce user input to the computer system 100 and communicate that user input to a processor 113. Other suitable input devices may be used in addition to, or in place of, the mouse 111 and the keyboard 110. An input/output unit 119 (I/O) coupled to system bus 118 represents such I/O elements as a printer, audio/video (A/V) I/O, etc.

Computer 100 also may include a video memory 114, a main memory 115 and a mass storage 112, all coupled to the system bus 118 along with the keyboard 110, the mouse 111 and the processor 113. The mass storage 112 may include both fixed and removable media, such as magnetic, optical or magnetic optical storage systems and any other available mass storage technology. The bus 118 may contain, for example, address lines for addressing the video memory 114 or the main memory 115. In some embodiments, the main memory 115 is a fully buffered dual inline memory module (FB-DIMM) that communicates serially with other system components.

The system bus 118 also may include a data bus for transferring data between and among the components, such as the processor 113, the main memory 115, the video memory 114 and the mass storage 112. The video memory 114 may be a dual-ported video random access memory. One port of the video memory 114, in one example, is coupled to a video amplifier 116, which is used to drive a monitor 117. The monitor 117 may be any type of monitor suitable for displaying graphic images, such as a cathode ray tube monitor (CRT), flat panel, or liquid crystal display (LCD) monitor or any other suitable data presentation device.

In some embodiments, processor 113 is a SPARC® microprocessor from Sun Microsystems, Inc., or a microprocessor manufactured by Motorola, such as the 680XX0 processor, or a microprocessor manufactured by Intel, such as the 80X86, or Pentium® processor. Any other suitable microprocessor or microcomputer may be utilized, however. As will be described in further detail below, the processor 113 may include embedded memory arrays that are configured to reduce power consumption while improving signal to noise margins (SNM), write times, and/or read times.

The computer system 100 also may include a communication interface 120 coupled to the bus 118. The communication interface 120 provides a two-way data communication coupling via a network link. For example, the communication interface 120 may be a local area network (LAN) card, or a cable modem, and/or wireless interface. In any such implementation, the communication interface 120 sends and receives electrical, electromagnetic or optical signals which carry digital data streams representing various types of information.

Code received by the computer system 100 may be executed by the processor 113 as it is received, and/or stored in the mass storage 112, or other non-volatile storage for later execution. In this manner, the computer system 100 may obtain program code in a variety of forms. Program code may be embodied in any form of computer program product such as a medium configured to store or transport computer readable code or data, or in which computer readable code or data may be embedded. Examples of computer program products include CD-ROM discs, ROM cards, floppy disks, magnetic tapes, computer hard drives, servers on a network, and/or solid state memory, which may be internal to one or more integrated circuits within the computer system 100.

Figure 2:
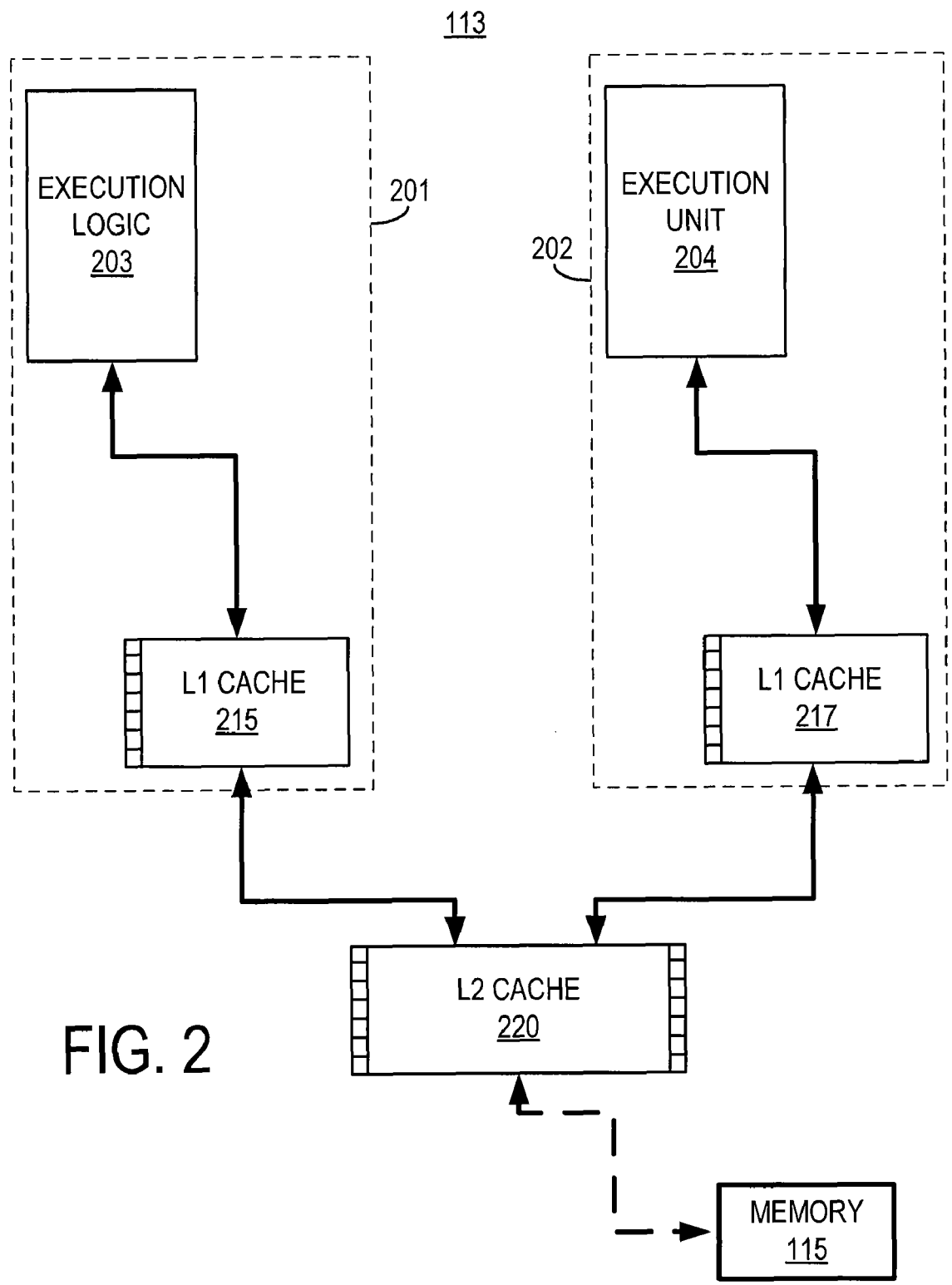
FIG. 2 illustrates an exemplary processor.

FIG. 2 illustrates an exemplary implementation of the processor 113 that may be capable of implementing power control of its embedded memories while improving signal to noise margins (SNM), write times, and/or read times. An shown the processor 113 may include one or more processing cores, such as the cores 201 and 202. Although the processor 113 may include any number of cores (such as the cores 201 and 202), the cores in the processor 113 may operate in a similar manner as the core 201, and therefore, only the core 201 will be described below.

The core 201 may include execution logic 203 coupled to one or more embedded memory arrays. For example, in the embodiment shown in FIG. 2, these memory arrays may include the level 1 (L1) cache 215 and/or the level 2 (L2) cache 220. The embedded memories may be arranged and accessed hierarchically in terms of access speed. In other words, the L1 cache 215 may be faster to read from and/or write to than the L2 cache 220. Thus, the core 201 may attempt to fulfill memory requests first from its L1 cache 215, and in the event that the L1 cache 215 does not contain the data the core 201 seeks, it may attempt to fulfill memory requests from the L2 cache 220 that is common to both the core 201 and 202. Although not specifically shown in FIG. 2, the processor may contain additional hierarchical levels of embedded memory, such as a level 3 (L3) cache, to access in the event that the data sought is not present in the L2 cache 220. Ultimately, the processor 113 may access the main memory 115, which is external to the processor 113, to obtain the data sought.

Generally, the area consumed by the various blocks of the processor 113 is often a concern because the larger the area consumed by the processor 113, the more the processor 113 will cost to manufacture. Accordingly, the embedded memories, such as the L1 cache 215 and/or the L2 cache 220, are often manufactured using transistors with the minimum available feature size. Due to the fact that smaller feature size transistors have higher leakage currents than larger transistors, however, manufacturing embedded memory using transistors with the minimum available feature sizes may cause the embedded memories to consume greater amounts of current during standby—i.e., when the embedded memory is not being written to or read from. Unfortunately, conventional approaches to reducing the power consumption of embedded memories often come with undesirable consequences, such as decreased signal-to-noise-margin (SNM), decreased write speed, and/or decreased read speed.

Figure 3A:
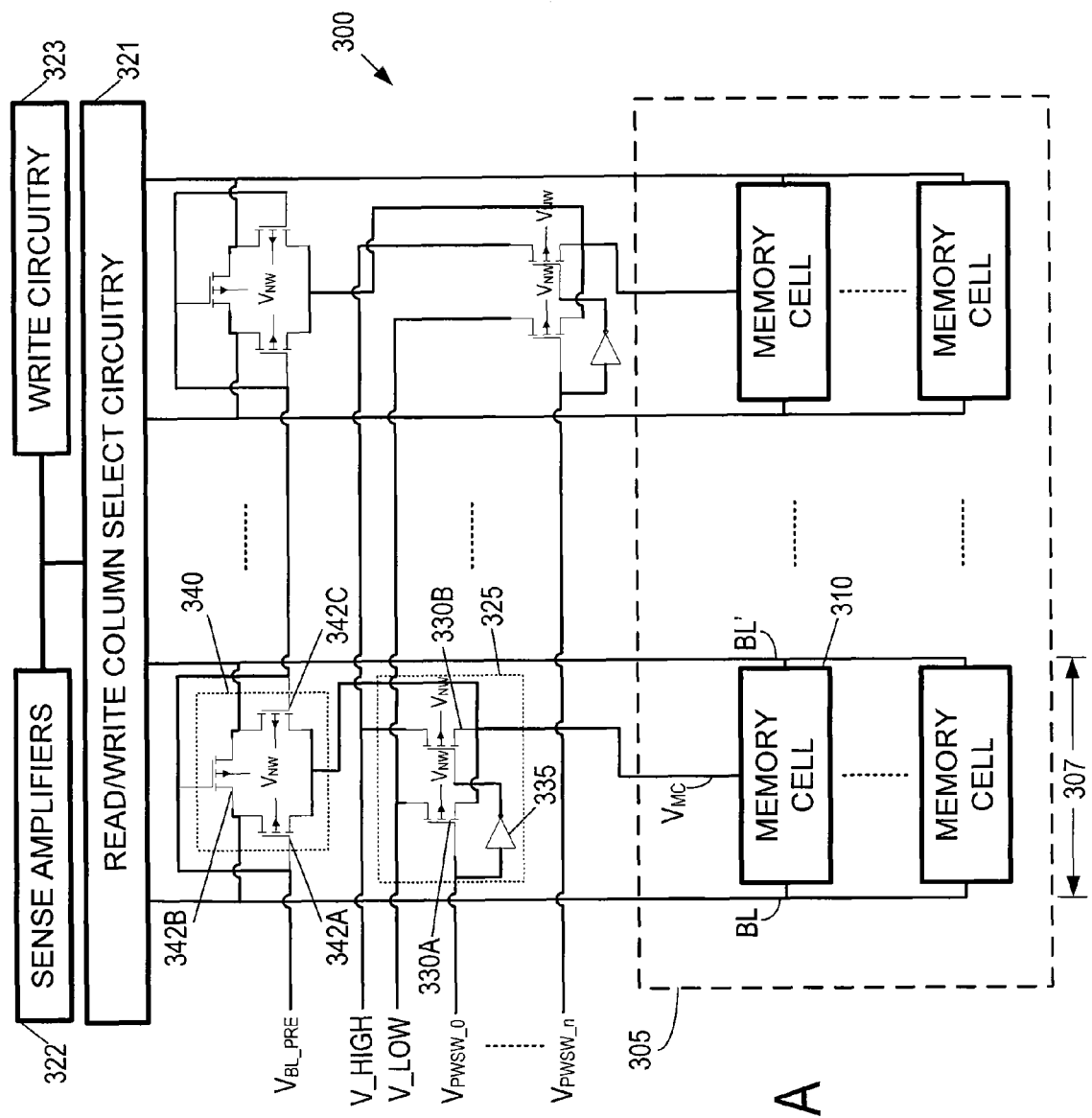
FIG. 3A illustrates an exemplary embedded memory.

FIG. 3A illustrates an exemplary embedded memory 300 that may be manufactured using minimum feature size transistors while implementing power saving strategies that overcome the undesirable consequences of conventional approaches. As shown, the memory 300 may include a plurality of memory cells arranged as an array 305. While the memory cells may be arranged in the array 305 with multiple columns and rows, a single column 307 within the array is referred to herein for the ease of discussion. It should be appreciated, however, that any number of columns may be operating simultaneously and the discussion of the operation and/or circuitry within the column 307 may be applied to any of the columns within the array 305.

Figure 3B:
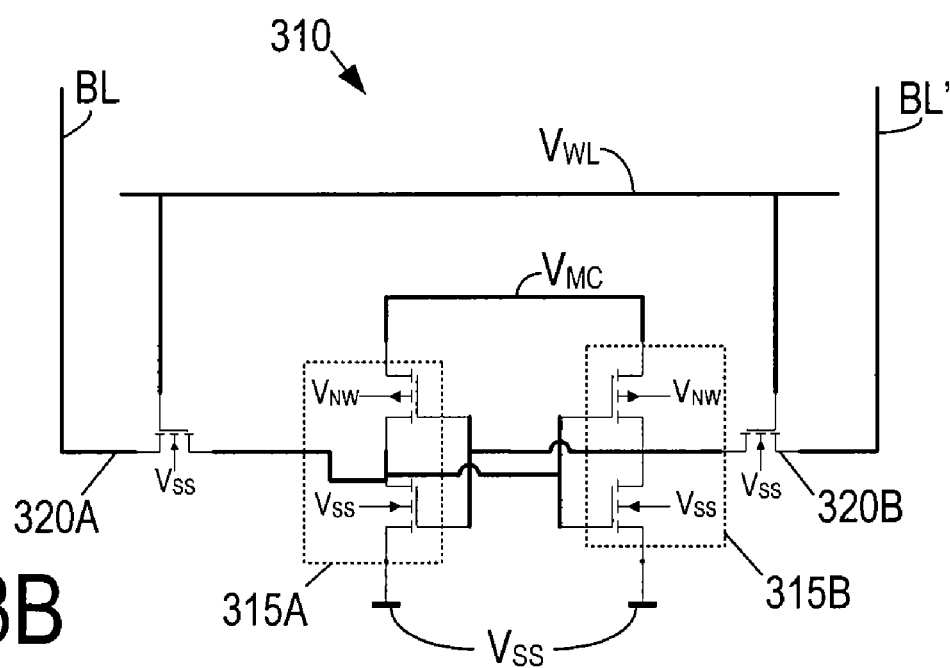
FIG. 3B illustrates an exemplary a memory cell.

In some embodiments, each memory cell within the array 305 may be capable of storing a single bit of information. For example, FIG. 3B illustrates but one implementation of the memory cell 310 as a six transistor static random access memory (SRAM) cell that may store a data value via the cross coupled inverters 315A-B. As will be described in further detail below, each p-type metal oxide semiconductor (PMOS) transistor in the inverters 315A-B may have its source connection coupled to a variable memory cell voltage $V_{MC}$ that may be modified to control the overall power consumption of the memory array 305. Also the substrate connection of these PMOS devices (labeled in FIG. 3B as $V_{NW}$) may be connected to a high voltage potential.

The drain connection of each PMOS transistor within the inverters 315A-B may be coupled to the inputs of the other inverter and the pass gate transistors 320A-B. The source connection of the n-type metal oxide semiconductor (NMOS) transistor within the inverters 315A-B may be coupled to a voltage that is less than $V_{MC}$, such as $V_{SS}$. The substrate connection of these NMOS devices may be connected to a low voltage potential, such as $V_{SS}$. The drain connection of the NMOS transistors within the inverters 315A-B may be coupled to the drain connections of the PMOS transistors within the inverters and the pass gate transistors 320A-B. It should be noted that although this disclosure may discuss the use of one type of transistor, such as an NMOS or PMOS transistors, other types of transistors may be substituted and still achieve the disclosed functionality. In this manner, any NMOS transistor shown may be substituted for a p-type MOS transistor (PMOS) and vice versa, and the polarities of the voltages may change accordingly to accommodate this substitution. Further, NMOS and PMOS transistors may be substituted for other types of technologies, such as bipolar junction transistors (BJTs).

Still referring to FIG. 3B, during operation, a data value may be stored to the memory cell 310 by modifying the voltage of the word line ($V_{WL}$) such that the threshold voltage of the pass gate transistors 320A-B is overcome. Thus, the word line voltage $V_{WL}$ may control the coupling between the bit lines and the inverters 315A-B. In other words, if the word line voltage $V_{WL}$ is equal to a high voltage power plane V_HIGH (shown in FIG. 3A), then the memory cell voltage $V_{MC}$ may be coupled to one of the bit lines (e.g., bit line BL) while the other bit line (bit line bar BL') may be coupled to $V_{SS}$. Note the pre-charging of the bit lines (discussed in detail below) also may be disabled during this time. Further, when the word line voltage $V_{WL}$ is equal to $V_{SS}$, then the memory cell 310 may be decoupled from the bit lines and the memory cell may retain its stored charge (e.g., $V_{MC}$) while the bit lines may be pre-charged as described below.

In some embodiments, the word line $V_{WL}$ may be coupled to a high voltage power plane V_HIGH (shown in FIG. 3A) when the pass gate transistors 320A-B couple the inverters 315A-B to the bit lines, and coupled to a low voltage power plane V_LOW (shown in FIG. 3A) when the pass gate transistors 320A-B do not couple the inverters 315A-B to the bit lines. The values of the V_HIGH and V_LOW power planes may vary between embodiments and may be configured relative to each other. For example, the V_HIGH power plane may be configured such that it is greater than the V_LOW power plane, and the V_LOW power plane may be configured to be greater than the value of $V_{SS}$. In some embodiments, the value of V_HIGH may be 1 volt, the value of V_LOW may be 0.6 volts, and the value of $V_{ss}$ may be zero volts.

Regardless of the particular values of V_HIGH and/or V_LOW, once the pass gate transistors 320A-B couple the memory cell 310 to the bit line BL and bit line bar BL' of the column 307, data may be read from or written to the memory cell 310 when a read/write column decoder 321 couples the bit line BL and bit line bar BL' of column 307 to either a sense amplifier 322 in the case of a memory read or write circuitry 323 in the case of a memory write.

The drain connections of the PMOS transistors within the inverters 315A-B may be coupled to $V_{MC}$. The value of $V_{MC}$ may be modified to control the amount of power that the processor 113 consumes during periods of inactivity. For example, if the processor 113 is executing a NOP instruction, there may be minimal or even no memory requests, and accordingly, the value of $V_{MC}$ may be reduced so as to reduce the amount of power consumed by the memory cell 310 and/or the memory array 305.

Referring again to FIG. 3A, the voltage value for $V_{MC}$ for the memory cells 310 within the column 307 may be selectively modified using a voltage level switch 325. The switch 325 may include a first PMOS transistor 330A with its drain coupled to the $V_{MC}$ terminal of the memory cells 310, its source connection coupled to the low voltage V_LOW power plane, and its gate connection coupled to the power switch voltage for $V_{PWSW}$. In some embodiments, as the value of $V_{PWSW}$ approaches a value that is a threshold voltage drop below the value of V_LOW, the PMOS transistor 330A may begin to conduct and couple the $V_{MC}$ terminal to the V_LOW power plane.

In a similar fashion, the switch 325 may include a second PMOS transistor 330B with its drain coupled to the $V_{MC}$ terminal of the memory cells 310. However, its source connection may be coupled to the high voltage V_HIGH power plane and its gate connection may be coupled to the power switch voltage for $V_{PWSW}$ though an inverter 335. In some embodiments, as the value of the voltage on the gate terminal of the PMOS transistor 330B approaches a value that is a threshold voltage drop below the value of V_HIGH, the PMOS transistor 330B may begin to conduct and couple the $V_{MC}$ terminal to the V_HIGH power plane. By operating the transistors 330A-B in this manner, the value of the $V_{MC}$ terminal may be transitioned between the V_HIGH and V_LOW values to conserve the amount of power that the memory array 305 consumes. For example, during periods of inactivity, such as the processor 113 executing one or more NOP instructions, the $V_{MC}$ terminal of one or more memory cells 310 may be coupled to the V_LOW value to consume less power. Unfortunately, since additional blocks within the memory also may be coupled to the $V_{MC}$ terminal, the value of the voltage on the $V_{MC}$ terminal may decrease and cause a decrease in the overall SNM of the memory cells 310. For example, a bit line pre-charge circuit 340 may be coupled to the $V_{MC}$ terminal and when it operates it may cause the voltage of the $V_{MC}$ terminal to decrease, and consequently, cause the SNM of the memory cell 310 to decrease.

In some embodiments, the pre-charge switch 340 may pre-charge the bit lines BL and BL' to predetermined values. In some embodiments, the bit line BL and bit line bar BL' connections may both be pre-charged to a V_LOW value to conserve power, where the V_LOW value may be from the $V_{MC}$ terminal of the power switch 325. As shown, the switch 340 may include three PMOS transistors 342A-C. During operation, as the value of $V_{BL\_PRE}$ goes low, the transistors 342A and 342C may begin to couple the memory cell voltage $V_{MC}$ (provided by the switch 325) to the bit lines. Also, when the value of $V_{BL\_PRE}$ goes low, the transistor 342B may solidify that both bit line BL and bit line bar BL' are at the same voltage by coupling them together. In this case, the V_LOW value may be provided from the $V_{MC}$ terminal provided to the memory cell 310. As mentioned previously, because the V_LOW value may be shared between the power switch 325 and the pre-charge circuit 340, the value of the memory cell voltage $V_{MC}$ may decrease when bit line BL and bit line bar BL' are pre-charged. By timing the operation of the switch 325, however, the voltage on the $V_{MC}$ terminal may be increased prior to the pre-charge occurring and prevent a decrease in the memory cell voltage $V_{MC}$.

Figure 4:
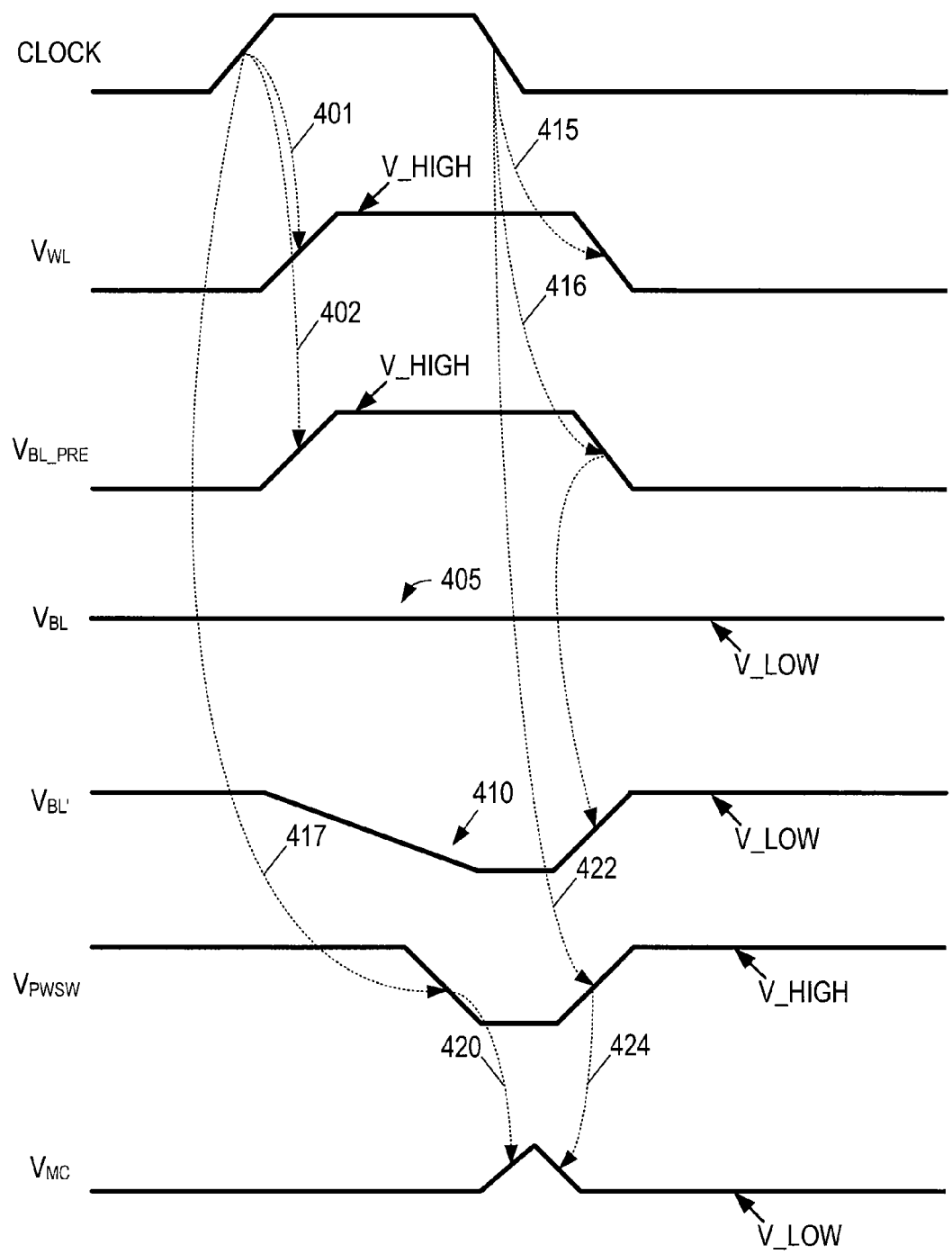
FIG. 4 illustrates exemplary timing signals for a write cycle that may enhance performance.

FIG. 4 illustrates exemplary timing signals for a write cycle to the memory column 307 that may compensate for the power dip of the memory cell voltage $V_{MC}$. A CLOCK signal may be provided to the memory 300. In the illustrated embodiment, the CLOCK signal is active HIGH such that the memory 300 is being written to during the high portion of the CLOCK, although other embodiments are possible where CLOCK may be active low. The write cycle may begin on the rising edge of the CLOCK as indicated by the arrows 401 and 402 showing $V_{WL}$ and $V_{BL\_PRE}$ rising after the assertion of the CLOCK signal. Referring momentarily to FIGS. 3A-B, since the pass gate transistors 320A-B are implemented with NMOS transistors, the word line voltage $V_{WL}$ may be active high. Thus, as the V_HIGH power plane is coupled to the word line and the word line voltage $V_{WL}$ is equal to V_HIGH, the memory cell 310 may be coupled to bit line BL and bit line bar BL' respectively through the transistors 330A-B. Also, since the pre-charge transistors 342A-B are implemented with PMOS transistors, the bit line pre-charge voltage $V_{BL\_PRE}$ may be active low. Thus, during the write operation shown in FIG. 4, the bit line BL and bit line bar BL' are not being pre-charged when the voltage $V_{BL\_PRE}$ is coupled to V_HIGH. Since FIG. 4 illustrates an exemplary write cycle, during this inactive pre-charge state the bit line BL and bit line bar BL' lines may be driven by write driving circuitry (shown below in FIG. 6A) such that the bit line BL voltage is V_LOW and the bit line bar BL' voltage is substantially equal to zero volts. This is indicated in FIG. 4 by the regions 405 and 410 respectively.

Once the write operation completes, the CLOCK signal goes back low, and the word line voltage $V_{WL}$ may transition back to V_LOW as indicated by the arrow 415. Similarly, after the de-assertion of the CLOCK signal, the $V_{BL\_PRE}$ voltage may transition back to V_LOW as indicated by the arrow 416, and thereby pre-charge bit line BL and bit line bar BL' to a value of V_LOW. As mentioned above, since the pre-charge switch 340 may be coupled to the memory cell voltage $V_{MC}$, this pre-charging may cause a decrease on the memory cell voltage $V_{MC}$, which may decrease the SNM of the memory cell. To overcome this problem, the memory cell voltage $V_{MC}$ may be momentarily coupled to the V_HIGH power plane so as to provide charge to the memory cell voltage $V_{MC}$ prior to entering the active pre-charge state. For example, prior to completing the write operation (indicated by arrow 415), the power switch voltage for $V_{PWSW}$ may be transitioned from V_HIGH to a low value (such as zero volts or V_LOW), for a predetermined amount of time. In this manner, the memory cell voltage $V_{MC}$ may be momentarily raised prior to entering the active pre-charge state. The actual width of the pre-determined pulse, and the consequent rise in the memory cell voltage $V_{MC}$ may vary between embodiments and may be optimized at around the target frequency of the CLOCK signal. Thus, as shown by the arrow 417, the power switch voltage for $V_{PWSW}$ may be transitioned from V_HIGH to a low value, thereby switching the memory cell voltage $V_{MC}$ to V_HIGH, at a predetermined period of time after the CLOCK signal rises as indicated by the arrow 420. Likewise, once the write operation completes and the active pre-charge is to take place, the pulse of the power switch voltage for $V_{PWSW}$ ends as indicated by the arrow 422, which may cause the memory cell voltage $V_{MC}$ to decrease to V_LOW as indicated by the arrow 424. Since the period defined between the arrows 420 and 424 may occur as the bit line BL and bit line bar BL' lines are being pre-charged, decreases in the memory cell voltage $V_{MC}$ that conventionally occur during the initial pre-charge may be prevented as shown by the substantially flat line for $V_{BL}$ and $V_{BL'}$ in FIG. 4 after the word line voltage $V_{WL}$ goes low.

Figure 5A:
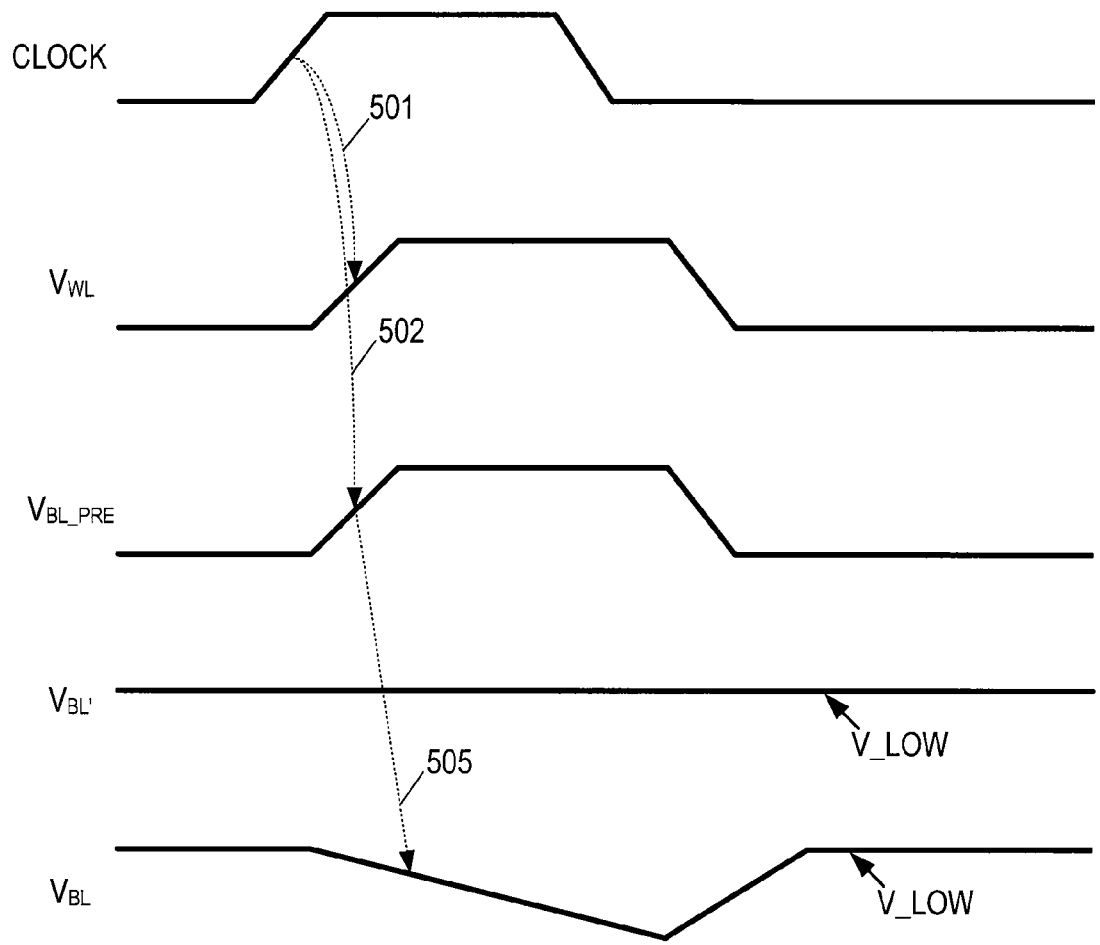
FIG. 5A illustrates exemplary timing signals for a read cycle with performance degradation.

In addition to providing improvements in the SNM of the memory cell 310, some embodiments also may adjust the bit line levels prior to accessing the memory cell 310 such that the read speeds may be increased. FIG. 5A illustrates exemplary timing signals for a read cycle to the memory column 307 illustrating how the read speed may degrade. The CLOCK signal shown in FIG. 5A may be similar to the clock signal shown in FIG. 4. Thus, the CLOCK signal may be active HIGH such that the memory 300 is being read from during the high portion of the CLOCK, although other embodiments are possible where CLOCK may be active low. The read cycle may begin on the rising edge of the CLOCK as indicated by the arrows 501 and 502 showing $V_{WL}$ and $V_{BL\_PRE}$ rising after the assertion of the CLOCK signal. As mentioned above, since the pass gate transistors 320A-B are implemented with NMOS transistors, when the word line voltage $V_{WL}$ is raised to V_HIGH, the memory cell 310 may be coupled to bit line BL and bit line bar BL' respectively through the transistors 330A-B. Also, as mentioned above, the bit line pre-charge voltage $V_{BL\_PRE}$ may be active low. Thus, during the read operation shown in FIG. 5A, the bit line BL and bit line bar BL' are not being pre-charged when the voltage $V_{BL\_PRE}$ is coupled to V_HIGH. To conserve power during periods when the memory is not being read, the bit lines BL and BL' may be charged to V_LOW. Unfortunately, during the read operation, the pre-charge circuitry may be turned off and the voltage value of the bit line BL may discharge as shown by the arrow 505 in FIG. 5A. Because the bit line BL may have been pre-charged to V_LOW for power consumption purposes, a decay of the charge may degrade the read speed of the memory cell 310 (arrow 505). That is, as the voltage on the bit line BL begins to decay, the memory cell 310 may have to overcome this discharge to convey its logic state to the bit line during a memory read.

Although this disclosure discusses discharge of the bit line BL, it should be appreciated that this discharge problem also may occur with respect to bit line bar BL', and therefore, these principles disclosed herein equally apply to bit line bar BL'. Also, the discharge problem shown in FIG. 5A may apply to bit lines during non-read cycles. For example, because bit lines of unselected columns during a write operation also may be pre-charged to V_LOW, these unselected columns may experience problematic discharge during write conditions that would slow them down on a subsequent read operation. Therefore, the principles disclosed herein equally apply to unselected bit lines during write operations.

Figure 5B:
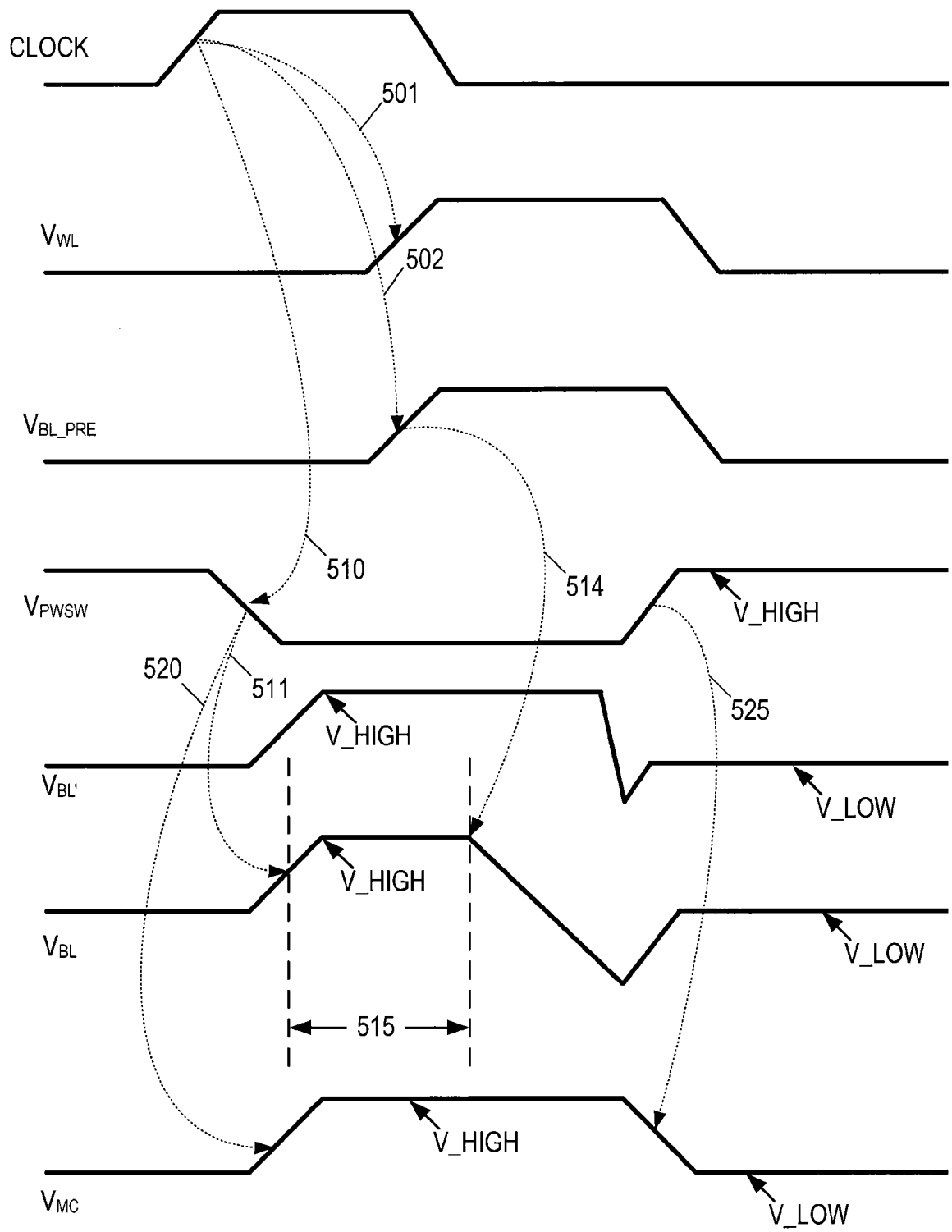
FIG. 5B illustrates exemplary timing signals for a read cycle that may enhance performance.

FIG. 5B illustrates exemplary timing signals for a read cycle to the memory column 307 that may compensate for a discharge when the pre-charge circuitry is inactive. Once the read operation begins, the CLOCK signal may cause the power switch voltage for $V_{PWSW}$ to go low such that the power switch 325 couples the V_HIGH power plane to the pre-charge circuit 340 (this is shown by the arrow 510). As shown in FIG. 5B, if the pre-charge voltage $V_{BL\_PRE}$ is low when the power switch voltage for $V_{PWSW}$ is low, then the bit line BL (and bit line bar BL') may be pre-charged to V_HIGH for a predetermined period of time prior to entering the read operation (indicated by the arrow 511). This pre-charging may begin as the power switch voltage for $V_{PWSW}$ transitions low, turning on the power switch 325, and ends when the pre-charge voltage $V_{BL\_PRE}$ transitions high, turning off the pre-charge circuit and allowing the bit line BL voltage $V_{BL}$ to decay as indicated by the arrow 514. The double sided arrow 515 indicates the overall length of this predetermined time period. By charging the bit line BL to V_HIGH prior to performing the read operation, the voltage on the memory cell 310 may begin discharging from a higher voltage, which may increase the amount of charge and speed with which a read operation may be performed. Additionally, as the $V_{PWSW}$ transitions low, the memory cell voltage $V_{MC}$ may go to V_HIGH (as indicated by the arrow 520) and may go low when $V_{PWSW}$ transitions high (as indicated by the arrow 525). Thus, the voltage of the memory cell 310 (shown in FIG. 3B) may be higher during the read operation shown in FIG. 5B (i.e., the word line enabling), and as a result, the speed with which the read operation is performed may be further increased.

Figure 6A:
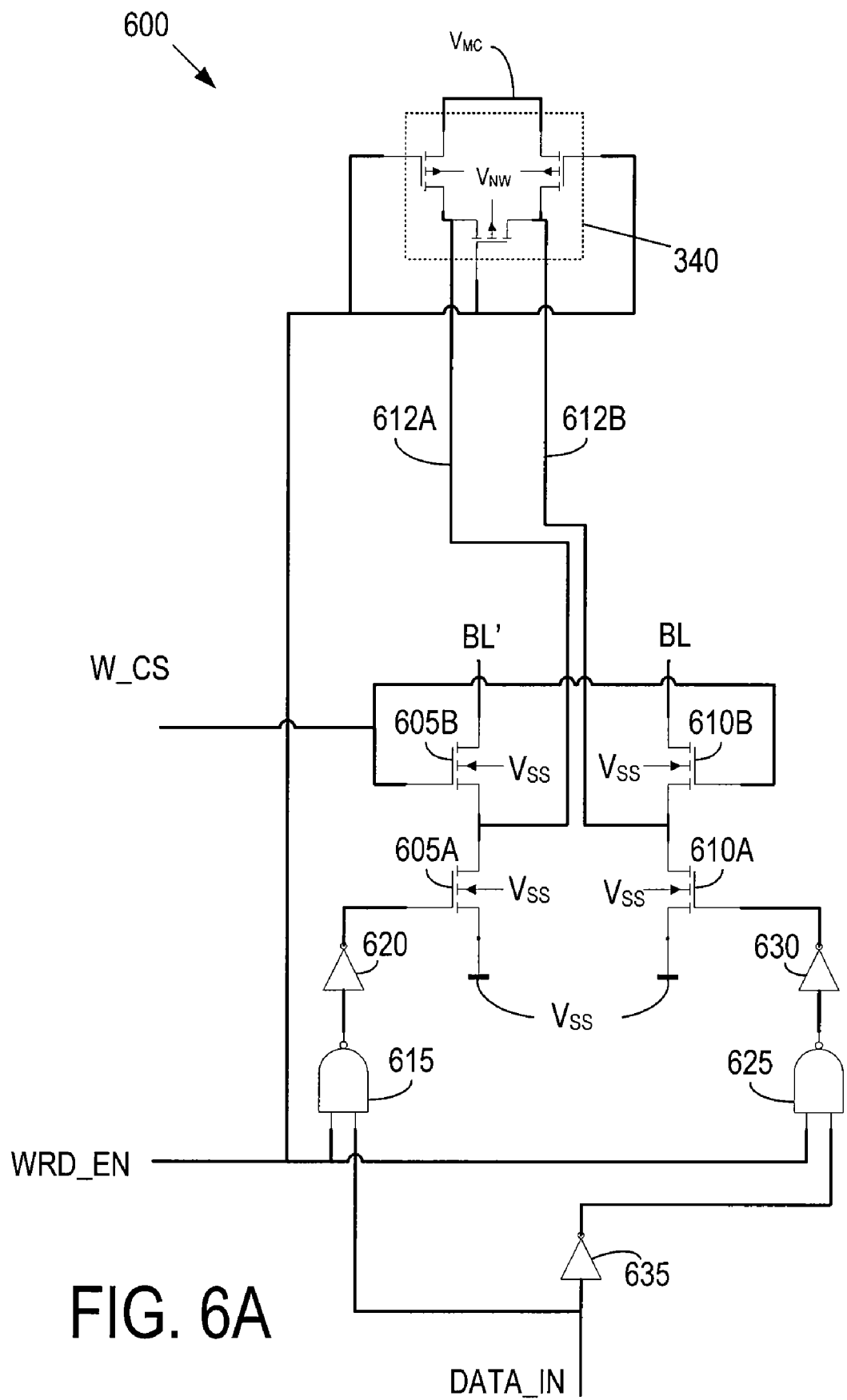
FIG. 6A illustrates exemplary write driver circuitry that may enhance performance.
Figure 6B:
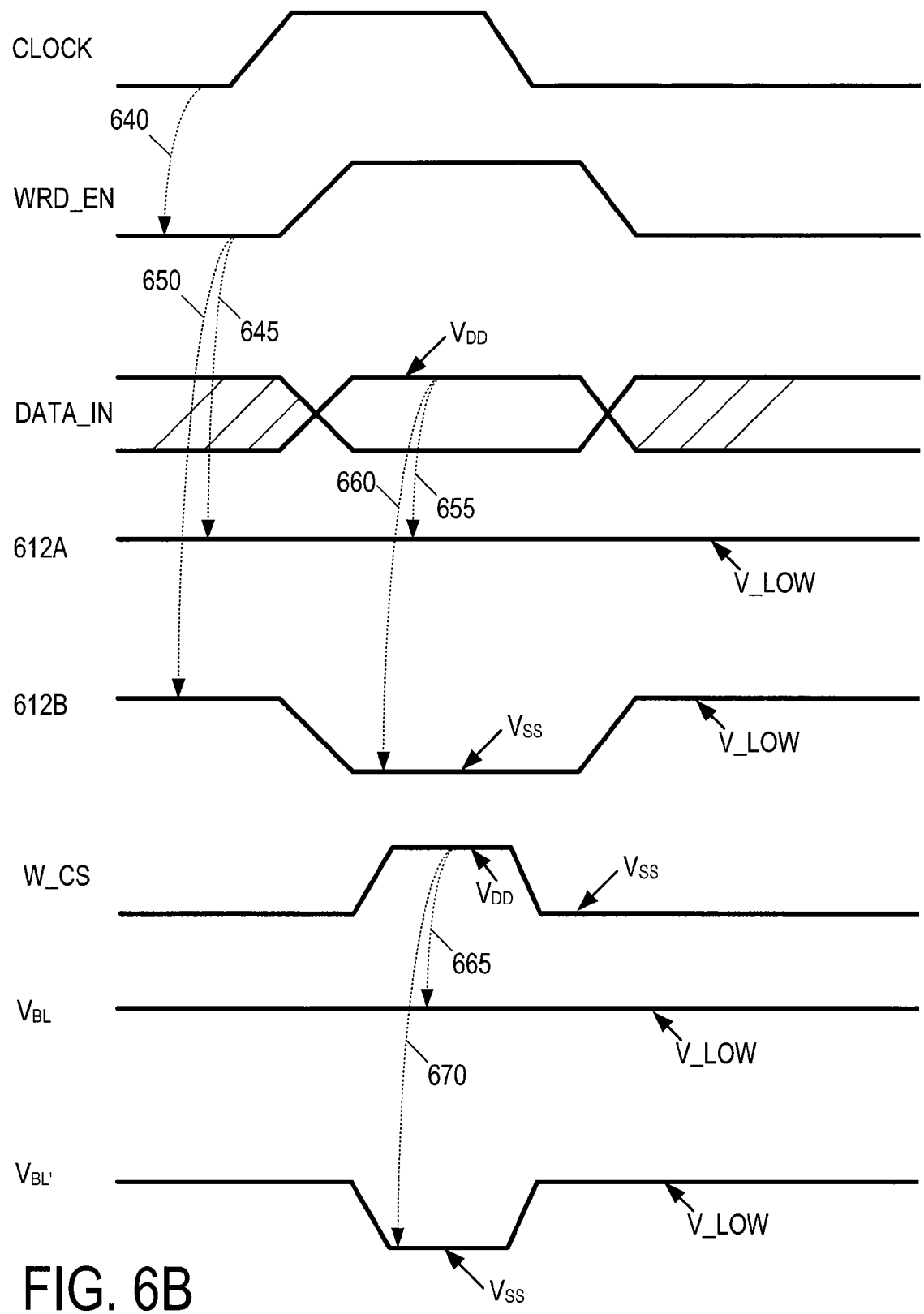
FIG. 6B illustrates exemplary timing signals for a write cycle that may enhance performance.

In addition to providing improvements in SNM and/or read speeds of the memory cell 310, some embodiments also may selectively orient the bit lines such that the write speeds may be increased. FIG. 6A illustrates exemplary write driver circuitry 600 capable of selectively orienting the bit lines to increase write speeds. As shown, NMOS transistors 605A-B may form one side of a write driver driving bit line BL of the memory cell 310 (shown in FIG. 3B) while NMOS transistors 610A-B may form the other side of the write driver driving bit line bar BL' of the memory cell 310. The drain connections of transistors 605A and 610A, and the source connections of the transistors 605B and 610B, may be coupled to the pre-charge circuit 340 (described above with regard to FIG. 3A and shown again in FIG. 6A for convenience) at nodes 612A-B. The gates of transistors 605B and 610B may couple to a write column select (W_CS) line. The gates of transistors 605A and 610A may be indirectly coupled to a write driver enable (WRD_EN) line and a data input (DATA_IN) line via one or more logic gates 615-635. FIG. 6B illustrates exemplary operations that may be performed by the circuitry 600 to selectively orient the bit lines such that the write speeds may be increased.

As shown, FIG. 6B illustrates a CLOCK signal that may operate akin to the clock signal shown in FIGS. 4, 5A, and 5B. The CLOCK signal may control whether the write circuitry 600 is operating. For example, as shown, when the CLOCK signal is low, the WRD_EN signal may be low (shown by arrow 640). When the WRD_EN is low, the outputs of the NAND gates 615 and 625 may be high and the outputs of inverters 620 and 630 may be low, and as a result, the transistors 605A and 610A to be off. Also, the WRD_EN signal being low may cause the pre-charge circuit 340 to conduct, which may make the source connections of the transistors 605B and 610B (nodes 612A and 612B respectively) equal to the pre-charge voltage of $V_{MC}$, which as described above with regard to FIG. 4, may be set to V_LOW to conserve power in the memory cell array 305. This is shown by arrows 645 and 650. In this manner, when the CLOCK and WRD_EN signals are low, the bit lines are not controlled by the circuit 600—i.e., the write driver circuit 600 is effectively off and the bit lines may be pre-charged as described above with regard to FIG. 4.

Once the WRD_EN signal goes high, it may enable the NAND gates 615 and 625 such that they may pass the data values presented to them. That is, the DATA_IN value may be passed through the NAND gate 615 and the NAND gate 625 may pass the opposite of this value by virtue of the inverter 635.

Depending upon the DATA_IN value, either transistor 605A or 610A may be turned on and begin to conduct. Assuming, for the sake of discussion, that DATA_IN is high, then transistor 605A may begin to conduct and transistor 610A may be turned off. Thus, node 612A may be coupled to a low voltage potential, such as $V_{SS}$, while node 612B may not be coupled to $V_{SS}$ and may maintain its pre-charged state of $V_{MC}$. This is shown with arrows 655 and 660 respectively. As a result, when the write column is selected, by taking WC_S high, the transistors 605B and 610B may be turned on such that the bit lines may be set to the values at nodes 612A-B respectively (shown with arrows 665 and 670 respectively). In other words, the DATA_IN values may propagate to bit line BL and bit line bar BL' such that bit line BL is set to a value of V_LOW as a high value (instead of going to $V_{DD}$) and bit line bar BL' is set to a value of $V_{SS}$ as a low value.

The precise voltage values that bit line BL and bit line bar BL' are set to may vary between embodiments. In some embodiments, the voltage values are set such that the difference between bit line BL and bit line bar BL' are greater than or equal to the threshold voltage of transistors used in the sense amplifiers 322 (shown in FIG. 3A). Because this difference in voltage values may be maintained above the threshold voltage of transistors within the sense amplifier 322, yet the bit line's high value may be at a lower voltage than conventional methods (e.g., V_LOW), the memory cell 310 may be written to faster than conventional approaches that attempt to conserve power for the memory cell 310. That is, the voltage necessary to write a high value to the bit line BL may be less than conventional low power approaches, and therefore, the speed with which a write cycle executes may be less than conventional low power approaches.

The above discussion is meant to be illustrative of the principles and various embodiments of the present invention. Numerous variations and modifications will become apparent once the above disclosure is fully appreciated. For example, instead of implementing the memory controls using PMOS transistors, NMOS transistors may be used along with consequent changes to the polarities of the various sources of power. Also, although the above disclosure may describe certain embodiments in the context of embedded memory, such as the type used in a microprocessor cache, it should be appreciated that the disclosed embodiments may be applied to stand-alone memories. The claims should be interpreted to include any and all such variations and modifications. In addition, the above description has broad application, and the discussion of any embodiment is meant only to be exemplary, and is not intended to intimate that the scope of the disclosure, including the claims, is limited to these embodiments.

We claim:

1. A microprocessor, comprising:
   at least one execution unit;
   a memory coupled to the execution unit, the memory comprising:
   a pre-charge circuit coupled to a memory cell, wherein the pre-charge circuit pre-charges a plurality of bit lines associated with the memory cell to a predetermined value;
   a voltage level switch coupled to the memory cell, wherein the voltage level switch selectively couples the memory cell between a first supply voltage and a second supply voltage, with the memory cell coupled to the second supply voltage during periods of inactivity in order to control the overall power consumption of the memory cell, the first supply voltage being greater than the second supply voltage; and
   a write driver circuit coupled to the memory cell, wherein a first bit line of the plurality of bit lines maintains the predetermined value prior to a memory access while a second bit line within the plurality of bit lines is discharged.

2. The microprocessor of claim 1, wherein the predetermined value is equal to a memory cell bus voltage within the memory cell and is less than at least one other voltage in the memory.

3. The microprocessor of claim 1, wherein the memory access is a write operation, the write operation occurring faster after the first bit line maintains the predetermined value.

4. The microprocessor of claim 1, wherein the predetermined value is maintained immediately before the memory access occurs.

5. The microprocessor of claim 1, wherein the voltage level switch comprises at least a first transistor and a second transistor, the first transistor having at least a first terminal and a second terminal and the second transistor having at least a first terminal and a second terminal, wherein the first terminal of the first transistor is coupled to the first supply voltage and the second terminal of the first transistor is coupled to the memory cell and the first terminal of the second transistor is coupled to the second supply voltage and the second terminal of the second transistor is coupled to the memory cell.

6. The microprocessor of claim 5, wherein the first transistor further comprises a third terminal coupled to a power switch voltage, the first supply voltage being coupled to the memory cell when a value of the power switch voltage approaches a value that is a threshold voltage drop below the value of the first supply voltage; and
   the second transistor further comprises a third terminal coupled to the power switch voltage, the second supply voltage being coupled to the memory cell when the value of power switch voltage approaches a value that is a threshold voltage drop below the value of the second supply voltage.

7. A memory, comprising:
   a pre-charge circuit coupled to a memory cell, wherein the pre-charge circuit pre-charges a plurality of bit lines associated with the memory cell to a predetermined value;
   a voltage level switch coupled to the memory cell, wherein the voltage level switch selectively couples the memory cell between a first supply voltage and a second supply voltage, with the memory cell coupled to the second supply voltage during periods of inactivity in order to control the overall power consumption of the memory cell, the first supply voltage being greater than the second supply voltage; and
   a write driver circuit coupled to the memory cell, wherein a first bit line within the plurality of bit lines maintains the predetermined value prior to a memory access while a second bit line within the plurality of bit line is discharged.

8. The memory of claim 7, wherein the predetermined value is less than at least one other voltage in the memory.

9. The memory of claim 8, wherein the predetermined value is equal to a memory cell bus voltage within the memory cell.

10. The memory of claim 7, wherein the memory access is a write operation.

11. The memory of claim 10, wherein the write operation occurs faster after the first bit line maintains the predetermined value.

12. The memory of claim 7, wherein the predetermined value is maintained immediately before the memory access occurs.

13. A method of operating a memory, the method comprising the acts of:
   coupling a pre-charge circuit to a memory cell;
   pre-charging a plurality of bit lines associated with the memory cell to a predetermined value;
   coupling a voltage level switch to the memory cell;
   switching the memory cell voltage between a first supply voltage level and a second supply voltage level to control power consumption of the memory cell;
   coupling a write driver to the memory cell; and
   maintaining the predetermined value on a first bit line within the plurality of bit lines prior to a memory access while a second bit line within the plurality of bit lines is being discharged.

14. The method of claim 13, wherein the predetermined value is less than at least one other voltage in the memory.

15. The method of claim 14, wherein the predetermined value is equal to a memory cell bus voltage within the memory cell.

16. The method of claim 13, wherein the memory access is a write operation.

17. The method of claim 16, wherein the write operation occurs faster after the act of maintaining the first bit line at the predetermined value occurs.

18. The method of claim 13, wherein the act of maintaining occurs immediately before the memory access wherein the predetermined value is maintained immediately before the memory access occurs.

19. A microprocessor, comprising:
   at least one execution unit;
   a memory coupled to the execution unit, the memory comprising:
      a memory cell comprising a memory cell bus;
      a power circuit selectively coupling the memory cell bus to a first power plane and a second power plane, wherein the memory cell bus is coupled to the second power plane when the power circuit is substantially off; and
      a bit line pre charge circuit couple to the power circuit, wherein the power circuit selectively couples the first power plane to the pre-charge circuit for a predetermined period of time.

20. The microprocessor of claim 19, wherein the memory cell power bus is charged from the first power plane during the predetermined period of time.

* * * * *